(12) United States Patent
Zhang et al.

(10) Patent No.: US 11,322,506 B2
(45) Date of Patent: May 3, 2022

(54) SEMICONDUCTOR STRUCTURE OF SPLIT GATE FLASH MEMORY CELL AND METHOD FOR MANUFACTURING THE SAME

(71) Applicant: Shanghai Huali Microelectronics Corporation, Shanghai (CN)

(72) Inventors: Lei Zhang, Shanghai (CN); Tao Hu, Shanghai (CN); Xiaochuan Wang, Shanghai (CN); Zhi Tian, Shanghai (CN); Qiwei Wang, Shanghai (CN); Haoyu Chen, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 5 days.

(21) Appl. No.: 16/861,967

(22) Filed: Apr. 29, 2020

(65) Prior Publication Data

US 2020/0350325 A1 Nov. 5, 2020

(30) Foreign Application Priority Data

Apr. 30, 2019 (CN) .......................... 201910362571.2

(51) Int. Cl.
*H01L 27/11524* (2017.01)
*H01L 21/265* (2006.01)
(Continued)

(52) U.S. Cl.
CPC ...... *H01L 27/11524* (2013.01); *H01L 21/046* (2013.01); *H01L 21/0415* (2013.01);
(Continued)

(58) Field of Classification Search
CPC ......... H01L 27/11524; H01L 27/11517; H01L 29/42328; H01L 29/66825; H01L 29/788; H01L 21/265; H01L 21/0415
See application file for complete search history.

(56) References Cited

U.S. PATENT DOCUMENTS 10,644,011 B1 * 5/2020 Fan .................. H01L 27/11521
2011/0095348 A1 * 4/2011 Chakihara ........... H01L 29/4975
257/298

(Continued)

*Primary Examiner* — Joseph C. Nicely

(57) ABSTRACT

The present invention provides a semiconductor structure for a split gate flash memory cell and a method of manufacturing the same. The split gate flash memory cell provided by the present invention at least includes a select gate and a floating gate formed on the substrate, one side of the select gate is formed with an isolation wall, and the floating gate is on the other side of the isolation wall. An ion implantation region is formed in an upper portion of the substrate below the isolation wall, wherein the ion implantation type of the ion implantation region is different from the ion implantation type of the substrate. The invention also provides a manufacturing method for manufacturing the above-mentioned split gate flash memory cell, and the manufacturing method provided by the invention can be compatible with the existing manufacturing process of the split gate flash memory cell without increasing the process cost and the process complexity. The manufactured split gate flash memory cell can reduce the influence of the channel inversion region on the channel current, thereby improving the characteristics of the channel current of the flash cell and optimizing the device performance.

12 Claims, 5 Drawing Sheets

(51) Int. Cl.
   *H01L 21/8234*    (2006.01)
   *H01L 29/423*     (2006.01)
   *H01L 29/66*      (2006.01)
   *H01L 27/11517*   (2017.01)
   *H01L 29/788*     (2006.01)
   *H01L 21/04*      (2006.01)
   *H01L 21/28*      (2006.01)

(52) U.S. Cl.
   CPC .... *H01L 21/265* (2013.01); *H01L 21/823418* (2013.01); *H01L 27/11517* (2013.01); *H01L 29/40114* (2019.08); *H01L 29/42328* (2013.01); *H01L 29/66825* (2013.01); *H01L 29/788* (2013.01); *H01L 29/7881* (2013.01)

(56) References Cited

U.S. PATENT DOCUMENTS

| | | | |
|---|---|---|---|
| 2015/0054053 A1* | 2/2015 | Park | H01L 29/42324 257/316 |
| 2015/0069486 A1* | 3/2015 | Park | H01L 27/11521 257/315 |
| 2017/0222017 A1* | 8/2017 | Hong | H01L 29/6659 |
| 2017/0352676 A1* | 12/2017 | Ogata | H01L 21/265 |

* cited by examiner understand

SEMICONDUCTOR STRUCTURE OF SPLIT GATE FLASH MEMORY CELL AND METHOD FOR MANUFACTURING THE SAME

CROSS-REFERENCE TO THE RELATED APPLICATION

The present application claims priority to Chinese Patent Application No. 201910362571.2, filed Apr. 30, 2019, the entire contents of which is incorporated herein for all purposes by this reference.

TECHNICAL FIELD

The present invention relates to the field of semiconductor structures and their manufacture, and more particularly to a structure of a split gate flash memory cell and its fabrication.

BACKGROUND

Flash memory is widely used due to its non-volatile nature, ease of programming and erasing, long life and low cost in various fields, including consumer electronics, network communication equipment, and industrial instrumentation embedded systems, automotive devices, etc. The floating gate structure based split gate flash memory is used as a type of flash memory, and is programmed by a source-side hot electron injection mechanism. The floating gate and the erase gate are used to perform the erase operation by using poly-to-Poly Enhance Tunneling, so that the program/erase efficiency is higher, a thicker tunnel dielectric layer can be used for superior reliability. At the same time, the use of an independent selection gate eliminates the problem of over-erasing and greatly simplifies product design. At present, typical split gate flash based on floating gate structure has SST ESF3 and Silvo-Flash (ZL201520483612.0), etc., all adopting independent four-gate structure.

A thick isolation layer (>165 A) is required between the select gate and the floating gate of the split gate flash cell to prevent reverse tunneling problems during high voltage programming. In the prior art, for the CMOS split gate flash memory cell, there is a pure P-type doped region under the isolation film layer between the select gate and the floating gate, and this region becomes a depletion region when the channel is inverted. Therefore, when the current is read, a large resistance is connected in series between the select gate channel and the floating gate channel, resulting in a low current.

With the development of high-level integration of flash memory technology, the size and operating voltage of flash memory cells are shrinking, the channel current level is decreasing, and the effect of the channel inversion depletion region below the isolation film layer between the select gate and the floating gate on the overall channel current is significantly increased, resulting in a reduction in the flash cell erase window, which ultimately leads to an increase in the number of erase-related failures in the yield and reliability tests.

Therefore, there is a need for a semiconductor structure for a split gate flash memory cell and a method of manufacturing the same that can reduce the influence of the channel inversion region on the channel current, thereby improving the characteristics of the channel current of the flash cell and optimizing device performance.

SUMMARY

A brief summary on one or more aspects is given below to provide the basic understanding for these aspects. This summary is not an exhaustive overview of all the contemplated aspects and is neither intended to indicate critical or decisive elements of all aspects nor to attempt to define the scope of any or all aspects. Its sole purpose is to present some concepts of one or more aspects in a simplified form as a preface for a more detailed description presented later.

As described above, in order to reduce the influence of the channel inversion region of the split gate flash memory cell on the channel current, the present invention provides a semiconductor structure of a split gate flash memory cell, the split gate flash memory cell comprising at least a select gate and a floating gate formed on a substrate, wherein an isolation wall is formed on a side of the select gate, a floating gate is on the other side of the isolation wall, and an ion implantation region is formed in an upper portion of the substrate below the isolation wall, wherein the ion implantation type of the ion implantation region is different from the ion implantation type of the substrate.

In an embodiment of the above semiconductor structure, optionally, the ion implantation region has an ion implantation type of N type, and the substrate has an ion implantation type of P type, wherein
the N-type ion used in the ion implantation region is arsenic.

In an embodiment of the above semiconductor structure, optionally, a source/drain ion implantation region of the isolation gate flash memory cell is formed on an upper portion of the substrate on the other side of the select gate and an upper portion of the substrate on the other side of the floating gate, wherein
the depth of the ion implantation region is smaller than the depth of the source/drain ion implantation region.

In an embodiment of the above semiconductor structure, optionally, the source/drain ion implantation region has the same ion implantation type as the ion implantation region, and
the ion concentration of the ion implantation region is lower than the ion concentration of the source/drain ion implantation region.

In an embodiment of the above semiconductor structure, optionally, the width of the ion implantation region is associated with the thickness of the isolation wall.

In an embodiment of the above semiconductor structure, optionally, the ion implantation region has a width of 165-185 angstroms.

The invention also provides a manufacturing method of a split gate flash memory cell, the split gate flash memory cell comprising at least a select gate and a floating gate, wherein the manufacturing method comprises:
providing a substrate of first type;
forming the select gate on the substrate;
forming an ion implantation region of second type on an upper portion of the substrate below an isolation wall formed on one side of the select gate, the first type being different from the second type; and
the floating gate is formed on the other side of the isolation wall.

In an embodiment of the above manufacturing method, optionally, the forming the ion implantation region further comprises:
performing the second type of ion implantation on the substrate after forming the select gate;
forming the isolation wall on one side of the select gate; and performing the first type of ion implantation on the substrate after forming the isolation wall to form the ion implantation region only in the upper portion of the substrate below the isolation wall.

In an embodiment of the above manufacturing method optionally, the depth of the first type of ion implantation is slightly greater than the depth of the second type of ion implantation to neutralize the second type of ion implantation.

In an embodiment of the above manufacturing method, optionally, the implantation concentration of the first type of ion implantation is equivalent to the implantation concentration of the second type of ion implantation to neutralize the second type of ion implantation.

In an embodiment of the above manufacturing method, optionally, the first type is a P type, the second type is an N type, and the N-type ion used to form the ion implantation region is arsenic.

In an embodiment of the above manufacturing method, optionally, the energy used to implant the arsenic is 10-15 KeV, and the dose used to implant the arsenic is 5E12-5E13 atom/cm$^2$, and performing the first type of ion implantation using boron; wherein the energy used to implant the boron is 5-8 KeV, and the dose used to implant the boron is 1E12-1E13 atom/cm$^2$.

In an embodiment of the above manufacturing method, optionally, the method further comprises: forming a source/drain ion implantation region of the split gate flash memory cell in an upper portion of the substrate on the other side of the select gate and an upper portion of the substrate on the other side of the floating gate, wherein the depth of the source/drain ion implantation region is greater than the depth of the ion implantation of first type.

In an embodiment of the above manufacturing method, optionally, the source/drain ion implantation region is of the second type, and the ion concentration of the ion implantation region is lower than the ion concentration of the source/drain ion implantation region.

In an embodiment of the above manufacturing method, optionally, the forming the ion implantation region further comprises:

after performing the second type of ion implantation, the select gate is pre-oxidized using a rapid thermal oxidation process.

In an embodiment of the above manufacturing method, optionally, the performing the pre-oxidation further comprises: performing the rapid thermal oxidation process at a temperature of 950 to 1050 degrees Celsius to form a pre-oxidized layer of 60-70 angstroms on a surface of the selection gate.

In an embodiment of the above manufacturing method, optionally, the width of the ion implantation region is associated with the thickness of the isolation wall.

In an embodiment of the above manufacturing method, optionally, wherein the ion implantation region has a width of 165 to 185 angstroms.

According to the semiconductor structure manufactured by the method for manufacturing a split gate flash memory cell provided by the present invention, An ion implantation region whose implantation type being different from the substrate implantation type is disposed under the isolation wall between the select gate and the floating gate. The region can effectively connect the channel inversion layer between the select gate and the floating gate when the channel is inverted, thereby ensuring the continuity of the overall channel, significantly improving the channel current of the erase state of the flash cell, and improving the erase-related device yield and reliability levels.

The manufacturing method provided by the invention has simple process and can be compatible with the existing manufacturing process of the split gate flash memory cell, does not cause additional manufacturing cost, does not increase process complexity, meets the requirements of mass production process technology, and has universality.

BRIEF DESCRIPTION OF THE DRAWINGS

The above features and advantages of the present invention will be better understood from the following description of the appended claims. In the figures, components are not necessarily drawn to scale, and components having similar related features or features may have the same or similar reference numerals.

Figure 1:
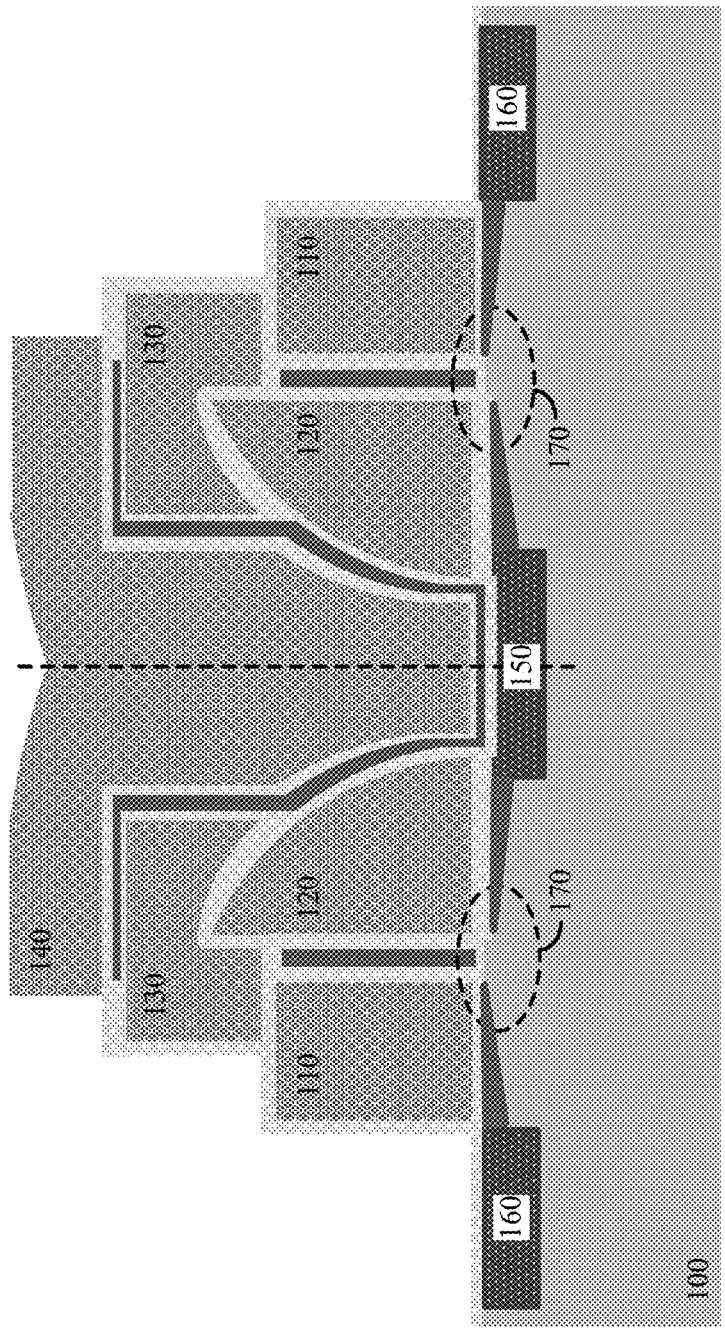
FIG. 1 shows a schematic structural view of a split gate flash memory cell manufactured in accordance with the prior art.

REFERENCE SIGNS 100, 200 substrate
110, 210 select gate
212 isolation wall
120, 220 floating gate
130, 230 erase gate
140, 240 control gate
150, 250 source ion implantation region
160, 260 drain ion implantation region
170 channel inversion region
280 second type of shallow ion implantation zone
281, 282 ion implantation zone
290 first type of shallow ion implantation zone

DETAILED DESCRIPTION

The invention is described in detail below with reference to the drawings and specific embodiments. It is to be noted that the aspects described below in conjunction with the drawings and the specific embodiments are merely exemplary and are not to be construed as limiting the scope of the invention.

This invention relates to semiconductor processes and devices. More specifically, embodiments of the present invention provide a semiconductor device that is a split gate flash memory cell, each split gate flash memory cell including at least a select gate and a floating gate formed on a substrate. There is an isolation wall between the select gate and the floating gate, an ion implantation region whose implantation type is different from the substrate type is formed in the upper portion of the substrate below the isolation wall. By additionally forming an ion implantation region whose implantation type is different from the substrate type, channel inversion layers of the select gate and the floating gate can be effectively connected when the channel is inverted, thereby ensuring the continuity of the channel and significantly improving the channel current of the erase state of the flash memory cell. The invention also provides other embodiments.

The following description is presented to enable one of ordinary skill in the art to implement and use the present invention and incorporate it into the context of a particular application. Various modifications, as well as various usages in various applications, will be readily apparent to those skilled in the art, and the generic principles defined herein may be applicable to a wide range of embodiments. Thus, the present invention is not limited to the embodiments presented herein, but rather should be given its broadest scope consistent with the principles and novel features disclosed herein.

In the following detailed description, numerous specific details are set forth to provide a more thorough understanding of the present invention. However, it will be apparent to those skilled in the art that the present invention may be practiced without limitations from these specific details. In other words, well-known structures and devices are shown in a block diagram form and are not shown in detail, so as to avoid obscuring the present invention.

The reader is cautioned as to all files and documents which are filed at the same time as this specification and which are open for the public to consult, and the contents of all such files and documents are incorporated herein by reference. Unless directly stated otherwise, all features disclosed in this specification (including any of the appended claims, the abstract, and the accompanying drawings) may be replaced by alternative features serving the same, equivalent, or similar purposes. Therefore, unless expressly stated otherwise, each of the features disclosed is only one example of a group of equivalent or similar features.

Note that when used, the flags left, right, front, back, top, bottom, front, back, clockwise, and counter-clockwise are used for convenience purposes only and do not imply any specific fixed direction. In fact, they are used to reflect the relative position and/or direction between various parts of an object.

As used herein, the terms "over . . . "under . . . ", "between . . . and . . . ", and "on . . . " means the relative position of that layer relative to another layer. Likewise, for example, a layer that is deposited or placed over or under another layer may be in direct contact with another layer or there may be one or more intervening layers. In addition, a layer that is deposited or placed between layers may be in direct contact with the layers or there may be one or more intervening layers. In contrast, a first layer "on" a second layer is in contact with the second layer. In addition, a relative position of a layer relative to another layer is provided (assuming that film operations of deposition, modification, and removal are performed in relative to a starting substrate, without considering the absolute orientation of the substrate).

Please refer to FIG. 1. FIG. 1 is a schematic structural diagram of a split gate flash memory cell manufactured by the prior art. FIG. 1 shows two conventional CMOS split gate flash cells that are axisymmetric with a dashed line. Each of the CMOS split gate flash memory cells generally includes a P-type substrate 100, a select gate 110 and a floating gate 120 formed on the substrate 100, and an isolation wall between the select gate 110 and the floating gate 120. A gate oxide layer locates between the select gate 110 and the substrate 100. A tunnel dielectric layer locates between the floating gate 120 and the substrate 100. The upper portion of the substrate 100 outside the select gate 110 is the drain ion implantation region 160 of the CMOS split gate flash memory cell, and the upper portion of the substrate 100 outside the floating gate 120 is the source ion implantation region 150 of the CMOS split gate flash memory cell. In the structure shown in FIG. 1, the two CMOS split gate flash cells share the source ion implantation region 150, thereby making the structure of the split gate flash device more compact. The erase gate 130 of the CMOS split gate flash cell covers the select gate 110 and the floating gate 120 described above. The control gate 140 of the CMOS split gate flash memory cell covers the shared source ion implantation region 150 and the floating gate 120 described above.

As can be seen from FIG. 1, in the existing structure, since the isolation wall between the select gate 110 and the floating gate 120 needs to be formed by using a thick film layer to prevent reverse tunnelling problem in high voltage programming. At the time of current reading, both the select gate 110 and the floating gate 120 are applied with voltage, and an N-type inversion conductive channel (triangles as shown in FIG. 1) can be formed on the upper portion of the P-type substrate 100. However, the upper portion of the substrate under the isolation wall is not controlled by the gate, and the inversion layer cannot be effectively formed, which is disadvantageous for the channel continuity. Although a thicker isolation wall can effectively isolate and prevent reverse tunnelling problems, a thick isolation wall can result in a large channel inversion region 170 that exists in the upper portion of the substrate below the isolation wall during current reading. Especially in the current situation that the feature size of the semiconductor device structure is shrinking, the influence of the existence of the channel inversion depletion region 170 on the erasing channel current is significantly increased, causing the flash cell erase window to be reduced, eventually resulting in the number of failures associated with erase operations in the yield and reliability test increases. This is undesirable for those skilled in the art, and is also a technical problem that those skilled in the art need to overcome.

Figure 2:
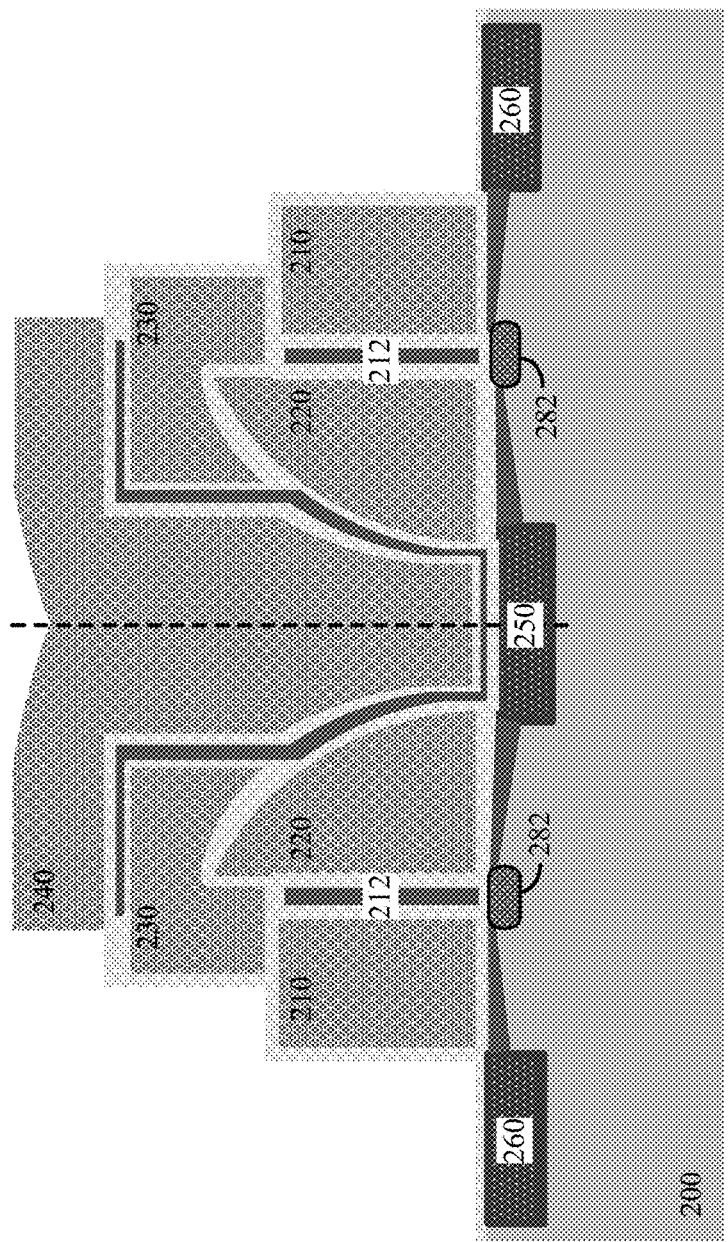
FIG. 2 is a schematic view showing the structure of a split gate flash memory cell provided by the present invention.

To this end, the present invention provides an improved semiconductor structure of a split gate flash memory cell, please refer to FIG. 2. FIG. 2 shows two CMOS split gate flash memory cells symmetrically arranged with respect to a dashed line according to an embodiment of the present invention. Each CMOS split gate flash memory cell includes a P-type substrate 200, a select gate 210 and a floating gate 220 formed on the substrate 200, an isolation wall 212 is on one side of the select gate 210, and the floating gate 220 is on the other side of the isolation wall 212. The isolation wall 212 is capable of effectively isolating the select gate 210 from the floating gate 220. Further, an ion implantation region 282 is additionally formed in the upper portion of the substrate 200 below the isolation wall 212. The ion implantation type of the above-described ion implantation region 282 is different from the ion implantation type of the substrate 200, and is an N-type ion implantation region.

It should be understood by those skilled in the art that in another embodiment, the present invention may provide a PMOS split gate flash memory cell. Correspondingly, the PMOS split gate flash memory cell includes an N-type substrate, a select gate and a floating gate formed on the substrate, an isolation wall is on one side of the select gate, and a floating gate is on the other side of the isolation wall, and an upper portion of the N-type substrate under the isolation wall is formed with an ion implantation region whose implantation type being different from the substrate. That is, a P-type ion implantation region is formed.

By forming an ion implantation region whose implantation type is different from the substrate under the isolation wall, it is possible to cause the upper portion of the substrate under the select gate and the floating gate to be channel-inverted under the control of the gate at the time of current reading. The above-mentioned ion implantation region whose implantation type is different from the substrate can effectively connect the channel inversion layers of the select gate and the floating gate, thereby ensuring the continuity of the overall channel, significantly improving the channel current of the erase state of the flash cell, and improving the erase-related device yield and reliability levels.

As shown in FIG. 2, the semiconductor structure of the split gate flash memory cell provided by the present invention further comprises a drain ion implantation region 260 formed in the upper portion of the substrate on the other side of the select gate 210, and a source ion implantation region 250 formed in the upper portion of the substrate on the other side of the floating gate 220.

It will be understood by those skilled in the art that although in the above embodiments, the drain ion implantation region 260 is formed outside the selection gate 210, the source ion implantation region 250 is formed on the other side of the floating gate, but according to different device designs and requirements, the position of the source/drain ion implantation region can be exchanged, that is, the upper portion of the substrate on the other side of the select gate is the source ion implantation region, and the upper portion of the substrate on the other side of the floating gate is the drain ion implantation region. The implantation zone is not limited to the above embodiment.

Further, for the ion implantation region 282 additionally provided in the split gate flash memory cell provided by the present invention, in order to prevent the presence of the ion implantation region 282 from changing the original electrical characteristics of the split gate flash memory cell, the implantation depth of the ion implantation region 282 should not be too deep, that is, it cannot be diffused too much, so that the puncture voltage of the channel is not lowered, and the original electrical characteristics of the device are not affected.

The implantation depth of the ion implantation region 282 described above is lower than the depth of the shallow channel ion implantation of the flash memory cell. In one embodiment, the implantation depth of the ion implantation region 282 is lower than the implantation depth of the source/drain ion implantation region.

Preferably, in order to better control the implantation depth of the ion implantation region 282 described above, arsenic (As) implantation is preferably used when the ion implantation region is an N-type ion implantation region. Since arsenic is difficult to implant for ion implantation, the diffusion speed is slow, and it is easy to control the implantation depth of arsenic, which is advantageous for precise control of the implantation depth of the ion implantation region 282 in the present invention.

The ion implantation type of the source ion implantation region 250 and the drain ion implantation region 260 are different from the ion implantation type of the substrate. Therefore, in the embodiment of the present invention, the source ion implantation region 250 and the drain ion implantation region 260 and the ion implantation region 282 are of the same ion implantation type. Further, in order to control the presence of the ion implantation region 282 not to change the original electrical characteristics of the split gate flash memory cell, so that the ion implantation concentration of the ion implantation region 282 is controlled to be lower than the ion implantation concentration of the source/drain ion implantation region.

Further, in order to control the presence of the ion implantation region 282 not to change the original electrical characteristics of the split gate flash memory cell, the ion implantation region 282 is formed only in the upper portion of the substrate below the isolation wall 212, and the ion implantation region 282 is controlled not to diffuse toward the upper portions of the substrate below the select gate 210 and the floating gate 220. As described above, since the upper portion of the substrate below the select gate 210 and the floating gate 220 can be controlled to form the channel inversion by the select gate 210 and the floating gate 220 at the time of current reading, the ion implantation region 282 is not desired to diffuse to the upper portions of the substrate below the select gate 210 and the floating gate 220.

In the above-described embodiment, control the width of the ion implantation region 282 to be associated with the thickness of the isolation wall 212, so that the ion implantation region 282 can be controlled to be formed only in the upper portion of the substrate below the isolation wall 212. Further, in order to ensure that the isolation wall 212 can form effective isolation between the select gate 210 and the floating gate 220 to avoid reverse tunnelling, the thickness of the isolation wall 212 is in the range of 165-185 angstroms. Therefore, the width of the formed ion implantation region 282 is controlled to be in the range of 165-185 angstroms, so that the presence of the ion implantation region 282 can connect the channel inversion layers of the select gate and the floating gate, thereby ensuring the continuity of the overall channel, significantly improving the channel current of the erase state of the flash cell, and improving the erase-related device yield and reliability levels without negatively affecting the existing electrical characteristics of the split-gate flash memory cell.

In the above embodiment, the isolation wall 212 is preferably of an ONO material. There are two main reasons for using ONO (Oxide/SiN/Oxide, silicon oxide/silicon nitride/silicon oxide) sidewalls: 1) electrically, the intermediate silicon nitride layer has a high dielectric constant and is better resistant to electrical shock; 2) in the process, the ONO film layer combination can utilize the etching selectivity ratio of silicon oxide and silicon nitride, and it is easy to control the etching to stop on the underlying silicon oxide during etching which means the controllability is good, so that the side wall formed at the same time has a good shape.

It should be understood by those skilled in the art that in the split gate flash memory cell provided by the present invention, the gate oxide layer is between the select gate 210 and the substrate 200, and the tunnel dielectric layer is between the floating gate 220 and the substrate 200.

In another embodiment, the split gate flash memory cells provided by the present invention may be symmetrically arranged along the axis of the dotted line as shown in FIG. 2, and the two split gate flash memory cells share the source ion implantation region 250, thereby making the structure of the split gate flash memory devices more compact.

Further, in the above embodiment, the split gate flash memory cell provided by the present invention may further include an erase gate 230 and a control gate 240, wherein the erase gate 230 covers the select gate 210 and the floating gate 220. The control gate 240 covers the shared source ion implantation region 250 and the floating gate 220.

With above in mind, the semiconductor structure of the split gate flash memory cell provided by the present invention has been described. By forming an ion implantation region whose implantation type is different from the substrate implantation type in the upper portion of the substrate under the isolation wall between the select gate and the floating gate, the channel inversion layers of the select gate and the floating gate can be effectively connected when the channel is inverted. Thereby the formed ion implantation region can ensure the continuity of the overall channel, significantly improve the channel current of the erase state of the flash cell, and improve the erase-related device yield and reliability levels without negatively affecting the existing electrical characteristics of the split-gate flash memory cell.

The present invention also provides a semiconductor process for manufacturing the semiconductor structure of the split gate flash memory cell provided by the present invention described above. Specifically, the method includes: providing a substrate of first type; forming a select gate on the substrate; and forming an ion implantation region of second type in the upper portion of the substrate below an isolation wall formed on one side of the selection gate, the first type being different from the first type a second type; and forming a floating gate on the other side of the isolation wall.

Figure 3:
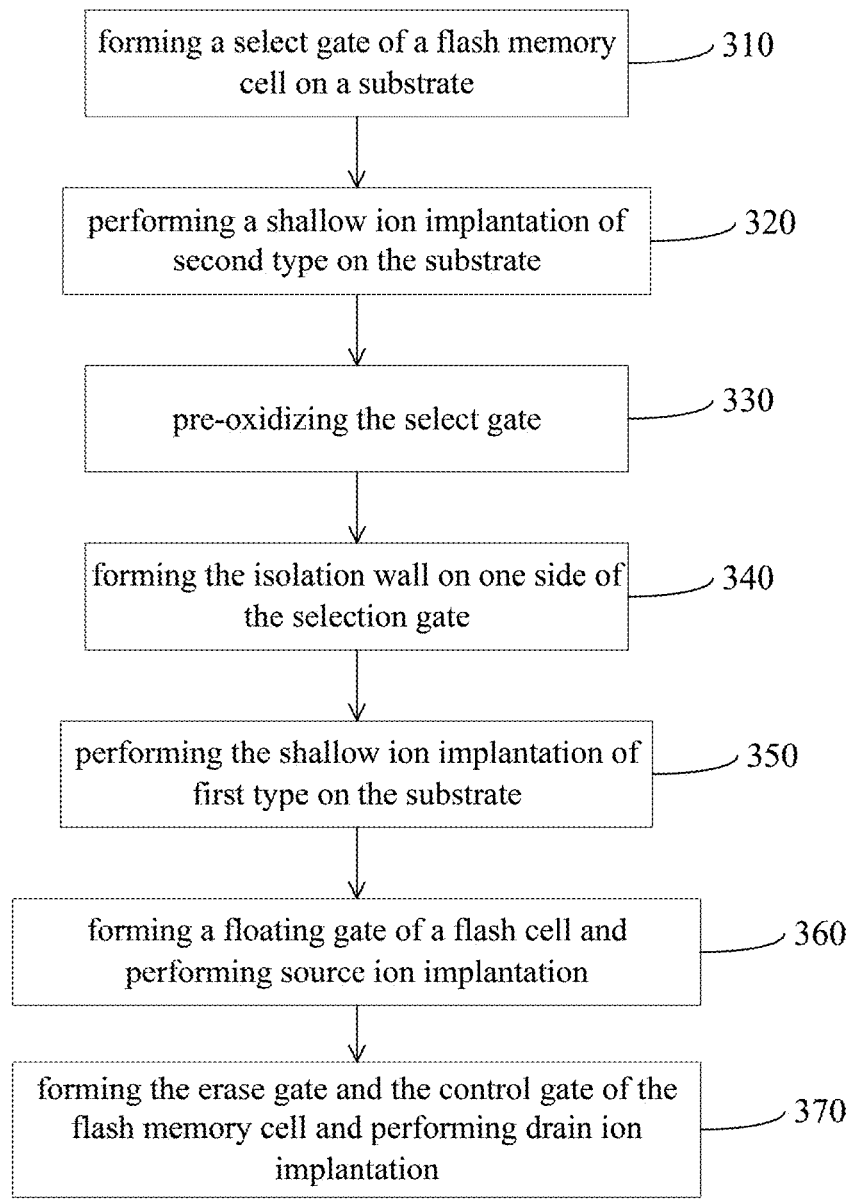
FIG. 3 is a flow chart showing an embodiment of a manufacturing method provided by the present invention.

More specifically, a specific embodiment of the semiconductor process provided by the present invention will be understood with reference to FIG. 3 in conjunction with FIGS. 4-7. FIG. 3 is a schematic flow chart showing an embodiment of a manufacturing method provided by the present invention, and FIGS. 4-7 are schematic structural views showing a split gate flash memory cell in a manufacturing process according to an embodiment of the manufacturing method provided by the present invention.

Figure 4:
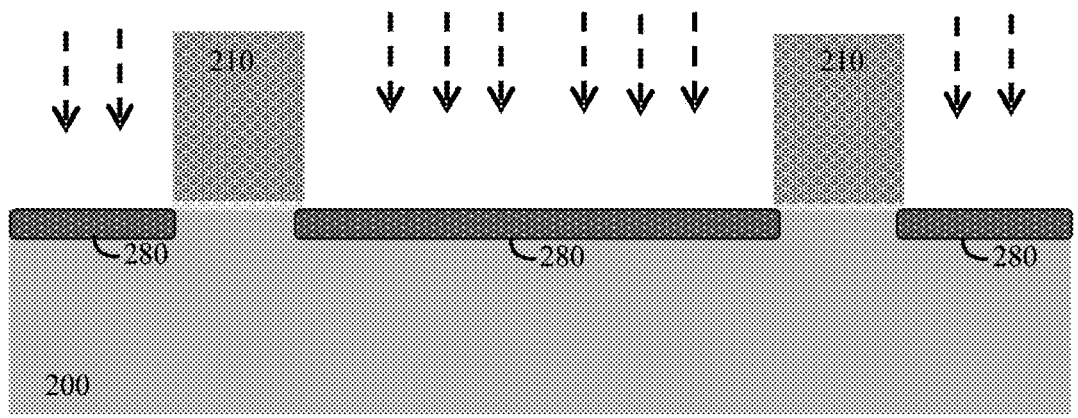
FIGS. 4-7 are schematic diagrams showing the structure of a split gate flash memory cell in a manufacturing process in accordance with an embodiment of the manufacturing method provided in accordance with the present invention.

Please refer to FIG. 4. FIG. 4 illustrates a semiconductor structure after performing the step 310 of FIG. 3: forming a select gate 210 of a flash memory cell on a substrate 200 of first type; and step 320: performing a shallow ion implantation of second type on the substrate 200, so that the ion implantation region 280 of second type is formed in the upper portion of the substrate other than the select gate 210.

In one embodiment, the substrate 200 is a P-type substrate, and the formed split gate flash memory cell is a CMOS. Therefore, the shallow ion implantation of second type is an N-type shallow ion implantation. It should be understood by those skilled in the art that the foregoing descriptions of the type of the substrate, the flash memory cell and the shallow ion implantation are merely illustrative, and those skilled in the art can make changes according to actual needs through the disclosure of the present invention, and are not limited to the above description.

Those skilled in the art should know that in the above step 310, the step of forming the select gate 210 may further include forming a gate oxide layer of the select gate 210 on the upper surface of the substrate, depositing polysilicon on the gate oxide layer, and forming a gate by etching the gate oxide layer and the polysilicon. Specifically, the select gate 210 may be formed by using existing or future technologies, and details are not described herein again.

In the above step 320, the ion implantation performed is shallow ion implantation, so that the implanted ions are only formed in the upper portion of the substrate. Moreover, by controlling the energy of the ion implantation, the depth of the ion implantation is lower than the depth of the shallow channel ion implantation of the flash memory cell, and the ion implantation is controlled to avoid excessive diffusion, thereby avoiding a decrease in the channel puncture voltage.

In one embodiment, the substrate of first type is a P-type substrate, and the ion implantation of second type is an N-type ion implantation. In order to control the depth and diffusion of the above-mentioned N-type ion implantation region 280, preferably, arsenic (As) implantation may be used, the energy is 10-15 KeV, and the dose is 5E12~5E13 atom/$cm^2$. Since arsenic is difficult to implant for ion implantation, the diffusion speed is slow, and it is easy to control the implantation depth of arsenic, which is advantageous for precise control of the implantation depth of the ion implantation region 282 in the present invention.

Preferably, in the above embodiment, in order to control the injected N-type ions from being excessively diffused, after the above step 320, step 330 may be preferably performed: pre-oxidizing the select gate 210. Further, the pre-oxidation uses a rapid thermal oxidation process (RTO) to form a pre-oxidation layer of 60-70 angstroms on the surface of the selection gate 210 at a temperature of 950-1050 degrees Celsius.

In the above embodiment in which the N-type ions are arsenic, the rapid thermal oxidation process can be combined with the rapid activation of arsenic and can be used to fix arsenic, thereby ensuring that arsenic does not diffuse too much and does not cause a decrease in channel puncture voltage. At the same time, the formed pre-oxidation layer can serve as a protective layer for the select gate 210 without affecting the final structure of the device.

Figure 5:
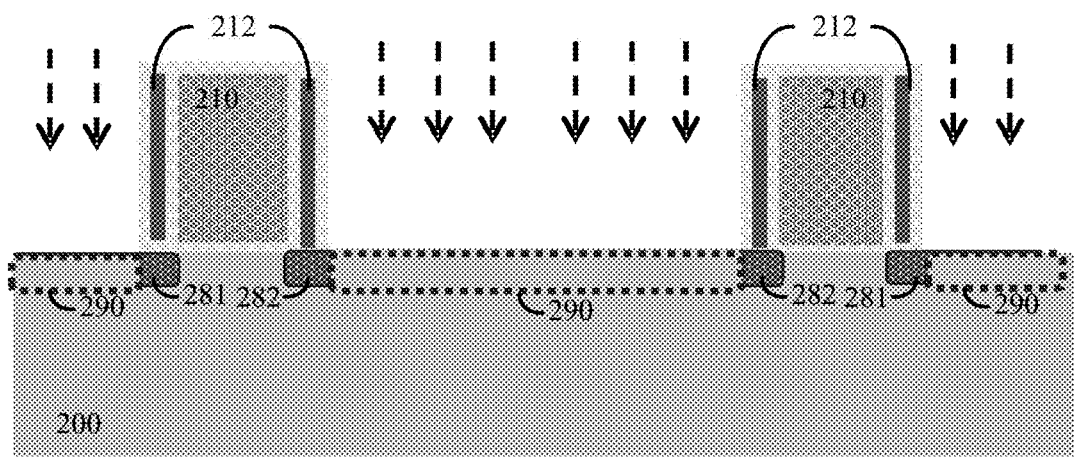

Please further refer to FIG. 5, which illustrates the semiconductor structure after performing the step 340 of FIG. 3: forming the isolation wall 212 on one side of the selection gate 210; and step 350: performing the shallow ion implantation of first type on the substrate 200. Such that an ion implantation region 290 of first type is formed in the upper portion of the substrate 200 other than the select gate 210 and the isolation barrier 212 to neutralize the ions of second type implanted in these regions in step 320. Only the upper portion of the substrate below the isolation wall 212 is left to form ion implantation regions 281, 282. Thus, in the structure illustrated in FIG. 5, the ion implantation regions 290 of first type are shown as dashed boxes to indicate that the regions after the performance of steps 320 and 350 are identical to the original state of the substrate 200.

Specifically, in the above step 340, the isolation wall 212 is formed of an ONO material (Oxide/SiN/Oxide, silicon oxide/silicon nitride/silicon oxide). Moreover, in the above step 340, the method further includes sequentially depositing silicon oxide/silicon nitride/silicon oxide on the device that has performed the shallow ion implantation of second type to cover the surface of the select gate 210 and the substrate 200, and then the ONO layer is etched to form an isolation wall 212 on both sides of the select gate 210.

Further, in an embodiment, the deposited ONO layer may have a thickness of 205-235 angstroms before etching, and ensure that the thickness of the isolation wall 212 formed after etching is in the range of 165-185 angstroms. Since the isolation wall 212 is used to form effective isolation between the select gate 210 and the floating gate 220 to avoid reverse tunnelling, the isolation wall 212 needs to have a certain thickness.

In an embodiment, the ONO layer is etched not only to form the isolation wall 212 on both sides of the selection gate 210, but also to retain the underlying silicon oxide layer. Preferably, the remaining silicon oxide layer is selected to have a thickness of 40-50 angstroms. The remaining silicon oxide layer can act as a protective layer in subsequent step 350, reducing damage to the channel surface caused by the ion implantation of first type.

Those skilled in the art should know that the above-mentioned isolation wall 212 can also be other materials, and is not limited to the ONO material. The sidewall of the ONO material is only a preferred embodiment. There are two main reasons for using ONO material as the side wall material: 1) electrically, the intermediate silicon nitride layer has a high dielectric constant and is better resistant to electrical shock; 2) in the process, the ONO film layer combination can utilize the etching selectivity ratio of silicon oxide and silicon nitride, and it is easy to control the etching to stop on the underlying silicon oxide during etching which means the controllability is good, so that the side wall formed at the same time has a good shape. Further, those skilled in the art should also know that the above steps of forming the isolation wall can be implemented by existing or future semiconductor technologies, and are not limited thereto, and details are not described herein again.

Specifically, the ion implantation of first type performed in step 350 is used to neutralize the ion implantation of second type performed in step 320, thus, the depth of the ion implantation of first type performed in step 350 is slightly greater than the depth of the ion implantation of second type performed in step 320, while the ion concentration of the ion implantation of first type performed in step 350 is equivalent to the ion concentration of the ion implantation of second type performed in step 320, thereby ensuring that the ion implantation of second type performed in step 320 can be completely neutralized.

In the embodiment that the first type is P type and the second type is N type, the ion implantation of first type in step 350 uses boron (B) at energy of 5-8 KeV and the dose of the boron is 1E12 to 1E13 atom/cm$^2$. Preferably, in the above embodiment, the P-type compensating ion implantation needs to penetrate the silicon oxide layer remained after etching the ONO sidewall of the select gate, thereby reducing the damage to the channel surface, and the final implantation depth is slightly deeper than the depth of the N type ion implantation layer.

It should be understood by those skilled in the art that in the above specific embodiments, although the energy and dose of boron implantation are smaller than the energy and dose of arsenic implantation, since the implantation of boron is easier than the implantation of arsenic, the use of the above energy and dose can ensure that the depth of the finally formed ion implantation regions 281, 282 is slightly smaller than the depth of the shallow ion implantation region 290 of first type, and the concentration of the ion implantation regions 281, 282 is comparable to the concentration of the shallow ion implantation region 290 of first type. The ion implantation in step 350 can be used to compensate or neutralize the ion implantation in step 320.

Further, since the ion implantation of first type performed in step 350 is formed after the formation of isolation wall 212, the ion implantation of first type performed in step 350 does not compensate or neutralize the shallow ion implantation region 281, 282 of second type located below the isolation wall 212 formed in step 320. By performing the ion implantation of second type first, then forming the isolation wall, and performing the ion implantation of first type with the isolation wall as an occlusion, no additional mask, photomask or hard mask is required to form an ion implantation region whose implantation type is different from the substrate implantation type under the isolation wall, which is compatible with the existing process and has universal applicability.

Moreover, since the upper portions of the substrate below the select gate 210 and the floating gate 220 can be controlled to form the channel inversion during the current reading by the selection gate 210 and the floating gate 220, the ion implantation region 282 is undesirable to diffuse to the upper portions of the substrate below the select gate 210 and the floating gate 220 to avoid negatively affecting on the original electrical characteristics of the split gate flash memory cell. The width of the ion implantation regions 281, 282 formed by the above method is related to the thickness of the isolation wall 212, so that the ion implantation region 282 can be controlled to be formed only on the upper portion of the substrate below the isolation wall 212, effectively avoiding the ion implantation region 281, 282 diffuse to the upper portions of the substrate below the select gate 210 and the floating gate 220.

In the above embodiment, the thickness of the isolation wall 212 is in the range of 165-185 angstroms, and therefore, the width of the formed ion implantation regions 281, 282 is in the range of 165-185 angstroms.

Figure 6:
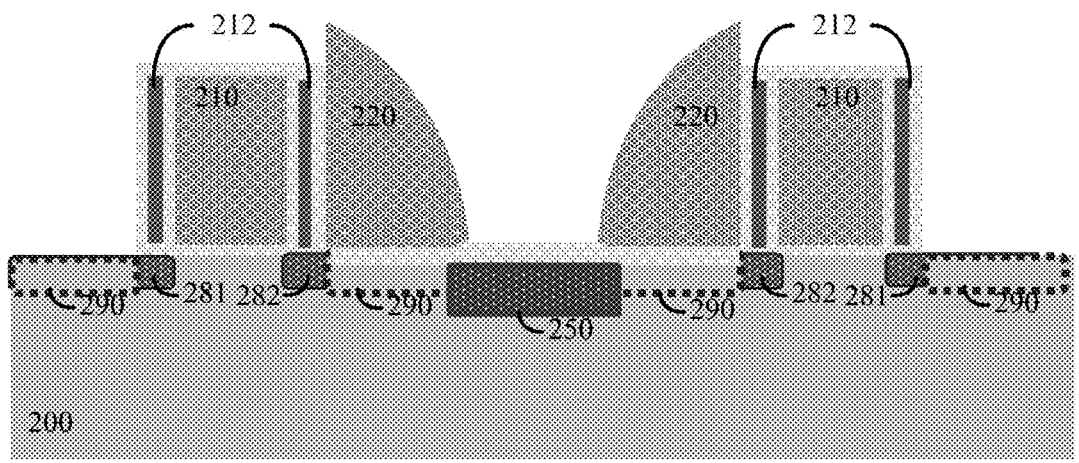

Please further refer to FIG. 6. FIG. 6 illustrates a semiconductor structure after performing step 360 of FIG. 3: forming a floating gate of a flash cell and performing source ion implantation.

It should be understood by those skilled in the art that the step of forming the floating gate 220 may further include: removing the silicon oxide layer remaining in the pre-step, forming a tunnel dielectric layer on the surface of the substrate 200, depositing a floating gate medium on the tunnel dielectric layer and the step of etching the medium. The manufacturing process of the specific floating gate 220 can be implemented by using existing or future semiconductor processes, and is not limited thereto, and details are not described herein again.

Further, the split gate flash memory cells provided by the present invention may be arranged in an axisymmetric manner as shown in FIG. 6. A shared source ion implantation region 250 may be formed on the upper portion of the substrate between the floating gates 220 of the two split gate flash cells, thereby making the structure of the split gate flash device more compact.

Specifically, the ion implantation type of the source ion implantation region 250 is different from that of the substrate, and therefore, in the present invention, the ion implantation type of the source ion implantation region 250 is the same as that of the ion implantation regions 281, 282. At the same time, in order to control the presence of the ion implantation region 282 not to change the original electrical characteristics of the split gate flash memory cell, the ion implantation concentration of the ion implantation region 282 and the ion implantation concentration of the shallow ion implantation of second type performed in step 350 are controlled to be lower than the ion implantation concentration of the source ion implantation region 250.

Moreover, as described above, the implantation depth of the ion implantation regions 281, 282 cannot be too deep, and the ion implantation regions 281, 282 cannot be diffused too much, so that the puncture voltage of the channel is not lowered, and the original electrical characteristics of the device are not affected, and therefore, in an embodiment, the implantation depth of the ion implantation regions 281, 282 and the depth of the shallow ion implantation of second type performed in step 350 are both lower than the implantation depth of the source ion implantation region 250 described above.

Figure 7:
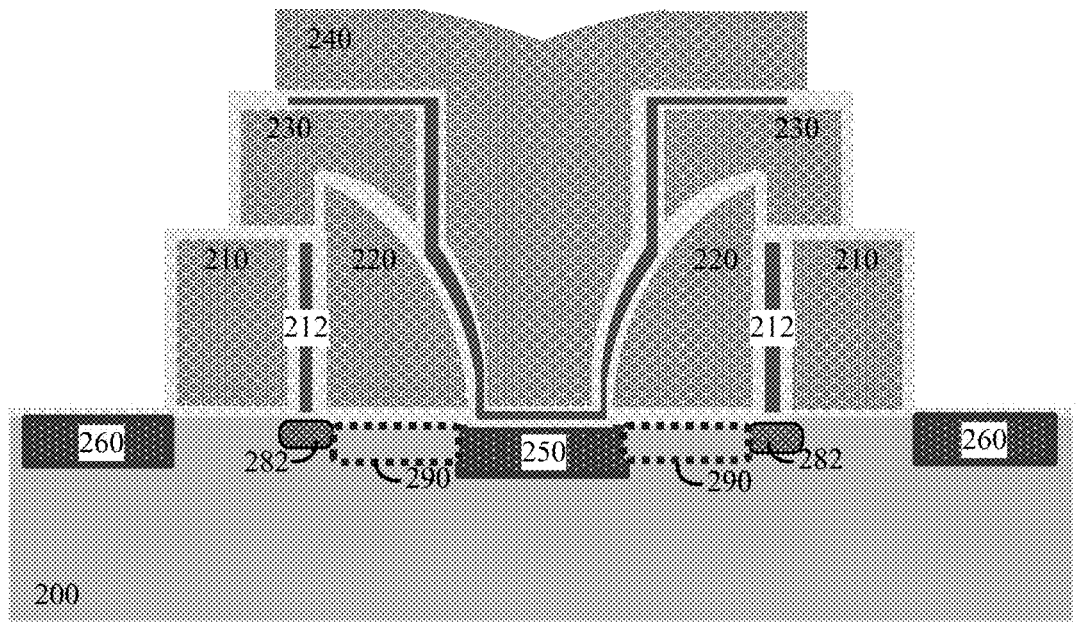

Please further refer to FIG. 7. FIG. 7 shows a semiconductor structure after performing step 370 in FIG. 3: forming the erase gate 230 and the control gate 240 of the flash memory cell and performing drain ion implantation.

It should be understood by those skilled in the art that the manufacturing process of the specific erase gate 230 and the control gate 240 can be implemented by using an existing or future semiconductor process, and is not limited.

Also, before performing the drain ion implantation, the step 370 may further include the step of removing the isolation wall outside the select gate 210 such that the drain ion implantation region 260 is formed on the upper portion of the substrate outside the select gate 210. The specific means for removing the spacer wall outside the gate 210 can be implemented by using an existing or future semiconductor process, and is not limited, and details are not described herein again.

Specifically, the ion implantation type of the drain ion implantation region 260 is different from that of the substrate, and therefore, in the present invention, the ion implantation type of the drain ion implantation region 260 is the same as that of the ion implantation regions 281, 282. At the same time, in order to control the presence of the ion implantation region 282 not to change the original electrical characteristics of the split gate flash memory cell, thus the ion implantation concentration of the ion implantation region 282 and the ion implantation concentration of the shallow ion implantation of second type performed in step 350 are both controlled to be lower than the ion implantation concentration of the drain ion implantation region 260.

Moreover, as described above, the implantation depth of the ion implantation regions 281, 282 cannot be too deep, and cannot be diffused too much, so that the puncture voltage of the channel is not lowered, and the original electrical characteristics of the device are not affected, and therefore, in an embodiment, the implantation depth of the ion implantation regions 281, 282 and the depth of the shallow ion implantation of second type performed in step 350 are both lower than the implantation depth of the drain ion implantation region 260 described above.

Therefore, although the ion implantation region 281 is formed in the pre-steps, the implantation depth and the implantation concentration of the drain ion implantation region 260 are both larger than those of the ion implantation region 281, and the influence of the ion implantation region 281 on the device can be ignored. Thus, no additional steps are required to remove the ion implantation region 281, which simplifies the steps in etching the isolation wall 212.

It will be understood by those skilled in the art that although in the above embodiments, the drain ion implantation region 260 is formed outside the selection gate 210, the source ion implantation region 250 is formed on the other side of the floating gate, but according to different device designs and requirements, the position of the source/drain ion implantation region can be exchanged, that is, the upper portion of the substrate on the other side of the select gate is the source ion implantation region, and the upper portion of the substrate on the other side of the floating gate is the drain ion implantation region, which is not limited to the above embodiment.

With above in mind, a specific embodiment of a method of manufacturing a split gate flash memory cell has been described. Those skilled in the art will appreciate that ion implantation regions 282 may also be formed in the upper portion of the substrate below the isolation wall 212 between the select gate 210 and the floating gate 220 by different means. For example, the ion implantation region 282 may be formed by forming a hard mask layer, patterning the hard mask layer, performing ion implantation, removing the hard mask, and the like after forming the select gate. Although other means are also compatible with existing processes, additional hard mask layers, photomasks, etc. may be required, resulting in additional manufacturing costs and due to the superposition of the process processes, it may not be possible to accurately control the ion implantation region 282 to be formed only under the isolation wall 212, or the implantation depth of the ion implantation region 282 may not be accurately controlled.

However, in the embodiment of the manufacturing method shown in FIG. 3 of the present invention, the manufacturing process is simple, and can be compatible with the existing manufacturing process of the split gate flash memory cell without causing additional manufacturing cost and increasing the complexity of the process, which can meet the technical requirements of mass production technology, and have universality. Moreover, in the embodiment of the manufacturing method as shown in FIG. 3, the relevant parameters of the ion implantation region 282 can be effectively controlled, thereby ensuring that the split gate flash memory unit can effectively connect the channel inversion layers of select gate and the floating gate when the channel is inverted by means of the ion implantation region. Thereby ensuring the continuity of the overall channel, significantly improving the channel current of the erase state of the flash cell, and improving the erase-related device yield and reliability levels, and the formed ion implantation region does not negatively affect the existing electrical characteristics of the split gate flash memory cell.

Heretofore, embodiments of a method for manufacturing a split gate flash memory cell and a structure thereof have been described. Although the present disclosure has been described with respect to certain exemplary embodiments, it will be apparent that various modifications and changes may be made to these embodiments without departing from the more general spirit and scope of the disclosure. Accordingly, the specification and the accompanying drawings are to be regarded in an illustrative rather than a restrictive sense.

It is to be understood that this description is not intended to explain or limit the scope or meaning of the claims. In addition, in the detailed description above, it can be seen that various features are combined together in a single embodiment for the purpose of simplifying the disclosure. The method of the present disclosure should not be interpreted as reflecting the intention that the claimed embodiments require more features than those expressly listed in each claim. Rather, as reflected by the appended claims, an inventive subject matter lies in being less than all features of a single disclosed embodiment. Therefore, the appended claims are hereby incorporated into the detailed description, with each claim standing on its own as a separate embodiment.

One embodiment or embodiments mentioned in this description is/are intended to be, combined with a particular feature, structure, or characteristic described in the embodiment, included in at least one embodiment of a circuit or method. The appearances of phrases in various places in the specification are not necessarily all referring to a same embodiment.

The invention claimed is:

1. A manufacturing method of a split gate flash memory cell, the split gate flash memory cell comprising at least a select gate and a floating gate, wherein the manufacturing method comprises:
   providing a substrate of first type;
   forming the select gate on the substrate;
   forming an isolation wall on one side of the select gate;
   forming an ion implantation region of second type in an upper portion of the substrate below the isolation wall, the first type being different from the second type; and forming the floating gate on one side of the isolation wall after forming the isolation wall,
wherein the isolation wall is disposed on one side of the floating gate and disposed between the select gate and the floating gate.

2. The manufacturing method according to claim 1, wherein the forming the ion implantation region comprises:
performing a second type of ion implantation on the substrate after forming the select gate and before forming the isolation wall; and
performing a first type of ion implantation on the substrate after forming the isolation wall to form the ion implantation region only in the upper portion of the substrate below the isolation wall.

3. The manufacturing method according to claim 2, wherein a depth of the first type of ion implantation is greater than a depth of the second type of ion implantation to neutralize the second type of ion implantation.

4. The manufacturing method according to claim 2, wherein an implantation concentration of the first type of ion implantation is equivalent to an implantation concentration of the second type of ion implantation to neutralize the second type of ion implantation.

5. The manufacturing method according to claim 2, wherein the first type is a P type, the second type is an N type, and
an N-type ion used to form the ion implantation region is arsenic.

6. The manufacturing method according to claim 5, wherein the energy used to implant the arsenic is 10-15 KeV, and the dose used to implant the arsenic is 5E12-5E13 atom/cm2, and
the first type of ion implantation is performed by using boron; wherein
the energy used to implant the boron is 5-8 KeV, and the dose used to implant the boron is 1E12-1E13 atom/cm2.

7. The manufacturing method according to claim 2, wherein the method further comprises: forming source/drain ion implantation regions of the split gate flash memory cell in an upper portion of the substrate on the other side of the select gate and an upper portion of the substrate on the other side of the floating gate, wherein
a depth of the source/drain ion implantation region is greater than a depth of the first type of ion implantation.

8. The manufacturing method according to claim 7, wherein the source/drain ion implantation region is of the second type, and
an ion concentration of the ion implantation region is lower than an ion concentration of the source/drain ion implantation region.

9. The manufacturing method according to claim 2, wherein the method further comprises:
after performing the second type of ion implantation, pre-oxidizing the select gate using a rapid thermal oxidation process.

10. The manufacturing method according to claim 9, wherein the pre-oxidizing comprises: performing the rapid thermal oxidation process at a temperature of 950 to 1050 degrees Celsius to form a pre-oxidized layer of 60-70 angstroms on a surface of the select gate.

11. The manufacturing method according to claim 1, wherein a width of the ion implantation region is associated with a thickness of the isolation wall.

12. The manufacturing method according to claim 11, wherein the ion implantation region has a width of 165 to 185 angstroms.

* * * * *